United States Patent
Yang et al.

(10) Patent No.: US 11,539,235 B1
(45) Date of Patent: Dec. 27, 2022

(54) UNINTERRUPTIBLE POWER SYSTEM AND POWER CONVERSION CIRCUIT THEREOF

(71) Applicant: Cyber Power Systems, Inc., Taipei (TW)

(72) Inventors: Yu-Cheng Yang, Taipei (TW); Kuang-Yu Yang, Taipei (TW); Cheng-Hsin Yeh, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 0 days.

(21) Appl. No.: 17/529,503

(22) Filed: Nov. 18, 2021

(30) Foreign Application Priority Data

Sep. 29, 2021 (CN) .......................... 202111148241.7

(51) Int. Cl.
| | | |
|---|---|---|
| *H02M 1/42* | (2007.01) | |
| *H02J 9/06* | (2006.01) | |
| *H02M 1/00* | (2006.01) | |
| *H03K 17/567* | (2006.01) | |
| *H02M 3/158* | (2006.01) | |

(52) U.S. Cl.
CPC .............. *H02J 9/061* (2013.01); *H02J 9/063* (2020.01); *H02M 1/0003* (2021.05); *H02M 3/158* (2013.01); *H03K 17/567* (2013.01)

(58) Field of Classification Search
CPC ..................................................... H02J 9/061
See application file for complete search history.

(56) References Cited

U.S. PATENT DOCUMENTS

| | | | |
|---|---|---|---|
| 9,935,549 B2 | 4/2018 | Westmoeland | |
| 2015/0054343 A1 | 2/2015 | Cui | |
| 2016/0111916 A1* | 4/2016 | Prakash | H02J 9/061 |
| | | | 307/64 |
| 2017/0373531 A1* | 12/2017 | Xu | H02J 9/061 |
| 2021/0044140 A1* | 2/2021 | Nagabhushanrao | H02J 9/068 |
| 2021/0191892 A1* | 6/2021 | Yu | H02J 3/0073 |
| 2022/0181905 A1* | 6/2022 | Agrawal | H02J 9/068 |

* cited by examiner

*Primary Examiner* — Jared Fureman
*Assistant Examiner* — Esayas G Yeshaw
(74) *Attorney, Agent, or Firm* — Bacon & Thomas, PLLC

(57) ABSTRACT

A power conversion circuit for an uninterruptible power system, including an inductor, a first capacitor, a second capacitor, a first switch, a second switch, a third switch, a first diode, a second diode, and a third diode body, is provided. A terminal of the second switch is electrically coupled to the inductor through the first switch, and another terminal of the second switch is electrically coupled to a neutral wire and the third switch. An anode and a cathode of the first diode are electrically coupled to the first switch and a positive DC bus, respectively. A cathode and an anode of the second diode are electrically coupled to the first switch and the third switch, respectively. A cathode and an anode of the third diode are electrically coupled to the third switch and a negative DC bus, respectively. In addition, an uninterruptible power system using the same is provided.

38 Claims, 19 Drawing Sheets

UNINTERRUPTIBLE POWER SYSTEM AND POWER CONVERSION CIRCUIT THEREOF

BACKGROUND OF THE INVENTION

Field of the Invention

The present invention relates to the technical field of power supply, and in particular, to an uninterruptible power system and a power conversion circuit thereof.

Description of Related Art

FIG. 1 shows a partial circuit of a conventional uninterruptible power system. Referring to FIG. 1, the uninterruptible power system 100 comprises a switch 130, a switch 140 and a conventional power conversion circuit 150. The power conversion circuit 150 comprises an inductor 152, a switch 154, a switch 156, a switch 158, a switch 160, a diode 162, a capacitor 164, a capacitor 166, and a diode 168. The coupling relationship of the above electronic components in the power conversion circuit 150 is shown in FIG. 1, and will not be repeated here. In FIG. 1, the switches 130 and 140 are implemented by relays, the switches 154 and 156 are implemented by silicon controlled rectifiers (SCRs), and the switches 158 and 160 are implemented by insulated gate bipolar transistors (IGBTs).

In addition, one terminal of the capacitor 164 is used as a positive DC bus (as indicated by a label +BUS), and the other terminal of the capacitor 164 is electrically coupled to a neutral wire N of an AC input 110. One terminal of the capacitor 166 is used as a negative DC bus (as indicated by a label −BUS), and the other terminal of the capacitor 166 is electrically coupled to the neutral wire N of the AC input 110. The switch 130 has a first terminal 130-1, a second terminal 130-2, and a third terminal 130-3. The first terminal 130-1 of the switch 130 is electrically coupled to a live wire L of the AC input 110, the second terminal 130-2 of the switch 130 is electrically coupled to a positive electrode of the battery 120, and the third terminal 130-3 of the switch 130 is electrically coupled to inductor 152. The switch 140 is electrically coupled between a negative electrode of the battery 120 and an anode of the diode 156. When the uninterruptible power system 100 is in an on-line mode, the third terminal 130-3 of the switch 130 is electrically coupled to the first terminal 130-1 of the switch 130, and the switch 140 is turned off. When the uninterruptible power system 100 is in a battery mode, the third terminal 130-3 of the switch 130 is electrically coupled to the second terminal 130-2 of the switch 130, and the switch 140 is turned on.

A shortcoming of the conventional power conversion circuit 150 is that when it is in operation, there are more electronic components through which current flows, resulting in more power loss caused by the electronic components of the power conversion circuit 150. As a result, the overall efficiency of the uninterruptible power system 100 will be reduced, and the volume and cost of the heat dissipation system of the uninterruptible power system 100 will increase.

SUMMARY OF THE INVENTION

An object of the present invention is to provide a power conversion circuit for an uninterruptible power system, of which there are less electronic components through which current flows during operation.

Another object of the present invention is to provide an uninterruptible power system adopting the above-mentioned power conversion circuit.

To achieve the above object, the present invention provides a power conversion circuit for an uninterruptible power system, which comprises an inductor, a first capacitor, a second capacitor, a first switch, a second switch, a third switch, a first diode, a second diode and a third diode. One terminal of the first capacitor is used as a positive DC bus, and the other terminal of the first capacitor is electrically coupled to a neutral wire of an AC input of the uninterruptible power system. One terminal of the second capacitor is used as a negative DC bus, and the other terminal of the second capacitor is electrically coupled to the neutral wire. The first switch has a first terminal, a second terminal and a first control terminal, and the first terminal is electrically coupled to one terminal of the inductor. The second switch has a third terminal, a fourth terminal and a second control terminal. The third terminal is electrically coupled to the second terminal, and the fourth terminal is electrically coupled to the neutral wire. The third switch has a fifth terminal, a sixth terminal and a third control terminal, and the fifth terminal is electrically coupled to the fourth terminal. An anode of the first diode is electrically coupled to the first terminal, and a cathode of the first diode is electrically coupled to the positive DC bus. A cathode of the second diode is electrically coupled to the first terminal, and an anode of the second diode is electrically coupled to the sixth terminal. As to the third diode, a cathode of the third diode is electrically coupled to the sixth terminal, and an anode of the third diode is electrically coupled to the negative DC bus.

To achieve the above objective, the present invention provides an uninterruptible power system, which comprises a power conversion circuit. The power conversion circuit comprises an inductor, a first capacitor, a second capacitor, a first switch, a second switch, a third switch, a first diode, a second diode, and a third diode. In addition, the uninterruptible power system further comprises a fourth switch and a fifth switch. One terminal of the first capacitor is used as a positive DC bus, and the other terminal of the first capacitor is electrically coupled to a neutral wire of an AC input of the uninterruptible power system. One terminal of the second capacitor is used as a negative DC bus, and the other terminal of the second capacitor is electrically coupled to the neutral wire. The first switch has a first terminal, a second terminal, and a first control terminal, and the first terminal is electrically coupled to one terminal of the inductor. The second switch has a third terminal, a fourth terminal, and a second control terminal. The third terminal is electrically coupled to the second terminal, and the fourth terminal is electrically coupled to the neutral wire. The third switch has a fifth terminal, a sixth terminal, and a third control terminal, and the fifth terminal is electrically coupled to the fourth terminal. An anode of the first diode is electrically coupled to the first terminal, and a cathode of the first diode is electrically coupled to the positive DC bus. A cathode of the second diode is electrically coupled to the first terminal, and an anode of the second diode is electrically coupled to the sixth terminal. A cathode of the third diode is electrically coupled to the sixth terminal, and an anode of the third diode is electrically coupled to the negative DC bus. The fourth switch has a seventh terminal, an eighth terminal, and a ninth terminal. The seventh terminal is electrically coupled to a live wire of the AC input, the eighth terminal is electrically coupled to a positive electrode of the battery, and the ninth terminal is electrically coupled to the other terminal of the inductor. As to the fifth switch, it is electrically coupled between a negative electrode of the battery and the cathode of the third diode. When the uninterruptible power system is in an online mode, the ninth terminal is electrically coupled to the seventh terminal, and the fifth switch is turned off. When the uninterruptible power system is in a battery mode, the ninth terminal is electrically coupled to the eighth terminal, and the fifth switch is turned on.

To achieve the above objective, the present invention provides a power conversion circuit for an uninterruptible power system, which comprises an inductor, a first capacitor, a second capacitor, a first switch, a second switch, a third switch, a fourth switch, a fifth switch and a diode. One terminal of the first capacitor is used as a positive DC bus, and the other terminal of the first capacitor is electrically coupled to a neutral wire of an AC input of the uninterruptible power system. One terminal of the second capacitor is used as a negative DC bus, and the other terminal of the second capacitor is electrically coupled to the neutral wire. The first switch has a first terminal, a second terminal, and a first control terminal, and the first terminal is electrically coupled to one terminal of the inductor. The second switch has a third terminal, a fourth terminal, and a second control terminal. The third terminal is electrically coupled to the second terminal, and the fourth terminal is electrically coupled to the neutral wire. The third switch has a fifth terminal, a sixth terminal, and a third control terminal, and the fifth terminal is electrically coupled to the fourth terminal. The fourth switch has a seventh terminal, an eighth terminal, and a fourth control terminal. The seventh terminal is electrically coupled to the positive DC bus, and the eighth terminal is electrically coupled to the first terminal. The fifth switch has a ninth terminal, a tenth control terminal. The ninth terminal is electrically coupled to the first terminal, and the tenth terminal is electrically coupled to the sixth terminal. As to the diode, a cathode of the diode is electrically coupled to the sixth terminal, and an anode of the diode is electrically coupled to the negative DC bus.

To achieve the above objective, the present invention provides an uninterruptible power system, which comprises a power conversion circuit. The power conversion circuit comprises an inductor, a first capacitor, a second capacitor, a first switch, a second switch, a third switch, a fourth switch, a fifth switch and a diode. In addition, the uninterruptible power system further comprises a sixth switch and a seventh switch. One terminal of the first capacitor is used as a positive DC bus, and the other terminal of the first capacitor is electrically coupled to a neutral wire of an AC input of the uninterruptible power system. One terminal of the second capacitor is used as a negative DC bus, and the other terminal of the second capacitor is electrically coupled to the neutral wire. The first switch has a first terminal, a second terminal, and a first control terminal, and the first terminal is electrically coupled to one terminal of the inductor. The second switch has a third terminal, a fourth terminal, and a second control terminal. The third terminal is electrically coupled to the second terminal, and the fourth terminal is electrically coupled to the neutral wire. The third switch has a fifth terminal, a sixth terminal, and a third control terminal, and the fifth terminal is electrically coupled to the fourth terminal. The fourth switch has a seventh terminal, an eighth terminal, and a fourth control terminal. The seventh terminal is electrically coupled to the positive DC bus, and the eighth terminal is electrically coupled to the first terminal. The fifth switch has a ninth terminal, a tenth terminal, and a fifth control terminal. The ninth terminal is electrically coupled to the first terminal, and the tenth terminal is electrically coupled to the sixth terminal. A cathode of the diode is electrically coupled to the sixth terminal, and an anode of the diode is electrically coupled to the negative DC bus. The sixth switch has an eleventh terminal, a twelfth terminal, and a thirteenth terminal. The eleventh terminal is electrically coupled to a live wire of the AC input, the twelfth terminal is electrically coupled to a positive electrode of the battery, and the thirteenth terminal is electrically coupled to the other terminal of the inductor. As to the seventh switch, it is electrically coupled between a negative electrode of the battery and the cathode of the diode. When the uninterruptible power system is in an online mode, the thirteenth terminal is electrically coupled to the eleventh terminal, and the seventh switch is turned off. When the uninterruptible power system is in a battery mode, the thirteenth terminal is electrically coupled to the twelfth terminal, and the seventh switch is turned on.

In order to make the above objects, technical features and gains after actual implementation more obvious and easy to understand, in the following, the preferred embodiments will be described with reference to the corresponding drawings and will be described in more detail.

BRIEF DESCRIPTION OF THE DRAWINGS

Other features and advantages of the present invention will become apparent in the following detailed description of the preferred embodiments with reference to the accompanying drawings, of which.

DESCRIPTION OF EMBODIMENTS

The characteristics, contents, advantages and achieved effects of the present disclosure will become more fully understood from the detailed description given herein below and the accompanying drawings which are given by way of illustration only, and thus are not limitative of the present disclosure.

As required, detailed embodiments are disclosed herein. It must be understood that the disclosed embodiments are merely exemplary of and may be embodied in various and alternative forms, and combinations thereof. As used herein, the word "exemplary" is used expansively to refer to embodiments that serve as illustrations, specimens, models, or patterns. The figures are not necessarily to scale and some features may be exaggerated or minimized to show details of particular components. In other instances, well-known components, systems, materials, or methods that are known to those having ordinary skill in the art have not been described in detail in order to avoid obscuring the present disclosure. Therefore, specific structural and functional details disclosed herein are not to be interpreted as limiting, but merely as a basis for the claims and as a representative basis for teaching one skilled in the art.

Figure 2:
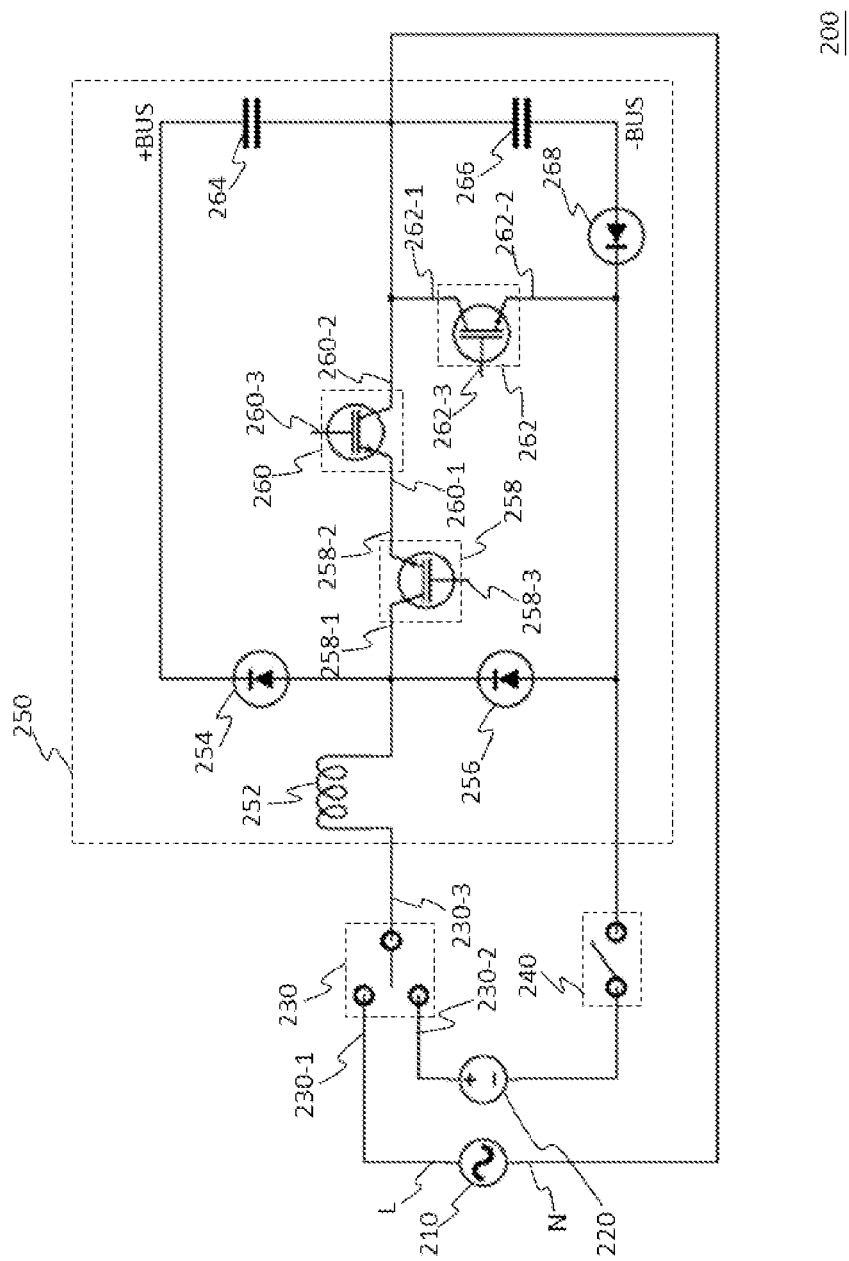
FIG. 2 shows a partial circuit of an uninterruptible power system according to an embodiment of the present invention.

FIG. 2 shows a partial circuit of an uninterruptible power system according to an embodiment of the present invention. Referring to FIG. 2, the uninterruptible power system comprises a switch 230, a switch 240, and a power conversion circuit 250. The power conversion circuit 250 comprises an inductor 252, a capacitor 264, a capacitor 266, a switch 258, a switch 260, a switch 262, a diode 254, a diode 256, and a diode 268. One terminal of the capacitor 264 is used as a positive DC bus (as indicated by a label +BUS), and the other terminal of the capacitor 264 is electrically coupled to a neutral wire N of an AC input 210 of the uninterruptible power system 200. One terminal of the capacitor 266 is used as a negative DC bus (as indicated by a label −BUS), and the other terminal of the capacitor 266 is electrically coupled to the neutral wire N. The switch 258 has a first terminal 258-1, a second terminal 258-2 and a control terminal 258-3, and the first terminal 258-1 is electrically coupled to one terminal of the inductor 252. The switch 260 has a first terminal 260-1, a second terminal 260-2, and a control terminal 260-3. The first terminal 260-1 of the switch 260 is electrically coupled to the second terminal 258-2 of the switch 258, and the second terminal 260-2 of the switch 260 is electrically coupled to the neutral wire N. The switch 262 has a first terminal 262-1, a second terminal 262-2 and a control terminal 262-3, and the first terminal 262-1 of the switch 262 is electrically coupled to the second terminal 260-2 of the switch 260.

An anode of the diode 254 is electrically coupled to the first terminal 258-1 of the switch 258, and a cathode of the diode 254 is electrically coupled to the positive DC bus. A cathode of the diode 256 is electrically coupled to the first terminal 258-1 of the switch 258, and an anode of the diode 256 is electrically coupled to the second terminal 262-2 of the switch 262. A cathode of the diode 268 is electrically coupled to the second terminal 262-2 of the switch 262, and an anode of the diode 268 is electrically coupled to the negative DC bus. The switch 230 has a first terminal 230-1, a second terminal 230-2, and a third terminal 230-3. The first terminal 230-1 of the switch 230 is electrically coupled to a live wire L of the AC input 210, the second terminal 230-2 of the switch 230 is electrically connected to a positive electrode of the battery 220, and the third terminal 230-3 of the switch 230 is electrically coupled to the other terminal of the inductor 252. As to the switch 240, it is electrically coupled between a negative electrode of the battery 220 and the cathode of the diode 268. When the uninterruptible power system 200 is in an online mode, the third terminal 230-3 of the switch 230 is electrically coupled to the first terminal 230-1 of the switch 230, and the switch 240 is turned off. When the uninterruptible power system 200 is in a battery mode, the third terminal 230-3 of the switch 230 is electrically coupled to the second terminal 230-2 of the switch 230, and the switch 240 is turned on.

In this example, the switches 230 and 240 are implemented by relays; however, this is not intended to limit the present invention. In addition, in this example, the switch 258, the switch 260, and the switch 262 are implemented by insulated gate bipolar transistors (IGBTs). For example, a collector, an emitter and a gate of an insulated gate bipolar transistor served as the switch 258 can be used as the first terminal 258-1, the second terminal 258-2, and the control terminal 258-3 of the switch 258, respectively, or be used as the second terminal 258-2, the first terminal 258-1, and the control terminal 258-3 of the switch 258, respectively. Certainly, the switch 258, the switch 260, and the switch 262 can also be implemented by MOS transistors (metal oxide semiconductor field effect transistors, MOSFETs), or implemented by bipolar junction transistors (BJTs). For example, a drain, a source, and a gate of a MOS transistor served as the switch 258 can be used as the first terminal 258-1, the second terminal 258-2, and the control terminal 258-3 of the switch 258, respectively, or be used as the second terminal 258-2, the first terminal 258-1, and the control terminal 258-3 of the switch 258, respectively.

It is worth mentioning that some insulated gate bipolar transistors have body diodes. Thus, if the switch 258, the switch 260, and the switch 262 are implemented by insulated gate bipolar transistors with body diodes, a cathode and an anode of a body diode of an insulated gate bipolar transistor served as the switch 258 should be electrically coupled to the first terminal 258-1 and the second terminal 258-2 of the switch 258, respectively, an anode and a cathode of a body diode of an insulated gate bipolar transistor served as the switch 260 should be electrically coupled to the first terminal 260-1 and the second terminal 260-2 of the switch 260, respectively, and a cathode and an anode of a body diode of an insulated gate bipolar transistor served as the switch 262 should be electrically coupled to the first terminal 262-1 and the second terminal 262-2 of the switch 262, respectively.

Similarly, some MOS transistors have body diodes. Thus, if the switch 258, the switch 260, and the switch 262 are implemented by MOS transistors with body diodes, a cathode and an anode of a body diode of a MOS transistor served as the switch 258 should be electrically coupled to the first terminal 258-1 and the second terminal 258-2 of the switch 258, respectively, an anode and a cathode of a body diode of a MOS transistor served as the switch 260 should be electrically coupled to the first terminal 260-1 and the second terminal 260-2 of the switch 260, respectively, and a cathode and an anode of a body diode of a MOS transistor served as the switch 262 should be electrically coupled to the first terminal 260-1 and the second terminal 262-2 of the switch 262, respectively.

The following will compare the number of electronic components through which current flows when the power conversion circuits of the uninterruptible power system 200 and the uninterruptible power system 100 are in operation.

Figure 3:
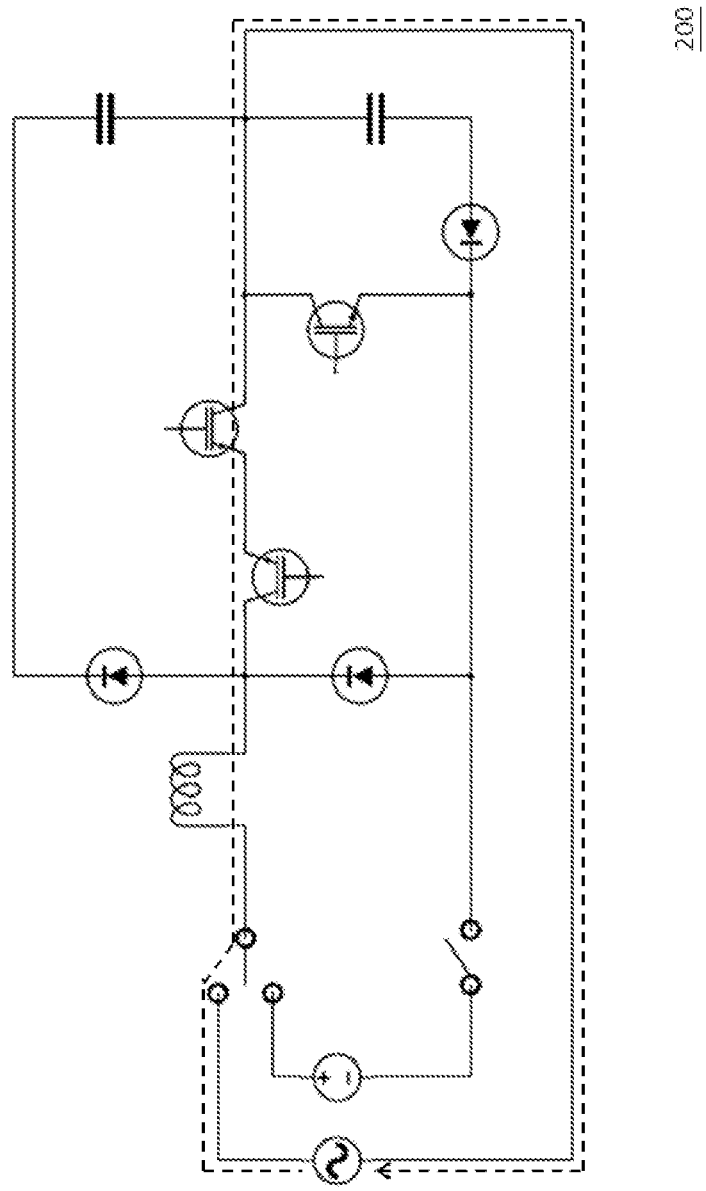
FIG. 3 shows a current path in the uninterruptible power system 200 in one of the states.
Figure 4:
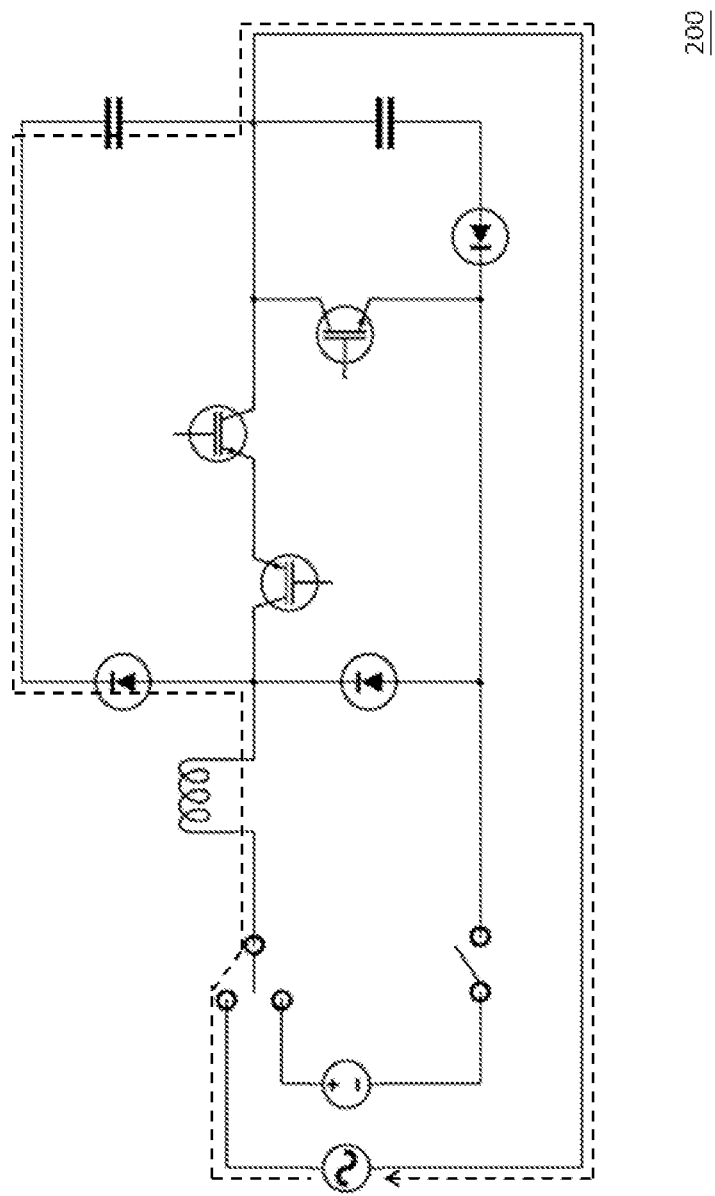
FIG. 4 shows a current path in the uninterruptible power system 200 in one of the states.

Referring to FIG. 2, when the uninterruptible power system 200 is in the online mode and outputs a positive half wave of an AC voltage, the power conversion circuit 250 continuously switches between a first state and a second state according to a predetermined frequency. The predetermined frequency is, for example, 20 kHz-40 kHz. In the first state, the switches 258 and 260 are turned on, and the switch 262 is turned off. The current path at this time is shown in FIG. 3. In the second state, the switches 258, 260, and 262 are turned off. The current path at this time is shown in FIG. 4. It can be seen from FIG. 3 that at this time, the current flows through three electronic components in the power conversion circuit 250 in sequence: the inductor 252, the switch 258, and the switch 260. It can be seen from FIG. 4 that at this time, the current flows through three electronic components in the power conversion circuit 250 in sequence: the inductor 252, the diode 254, and the capacitor 264.

Figure 1:
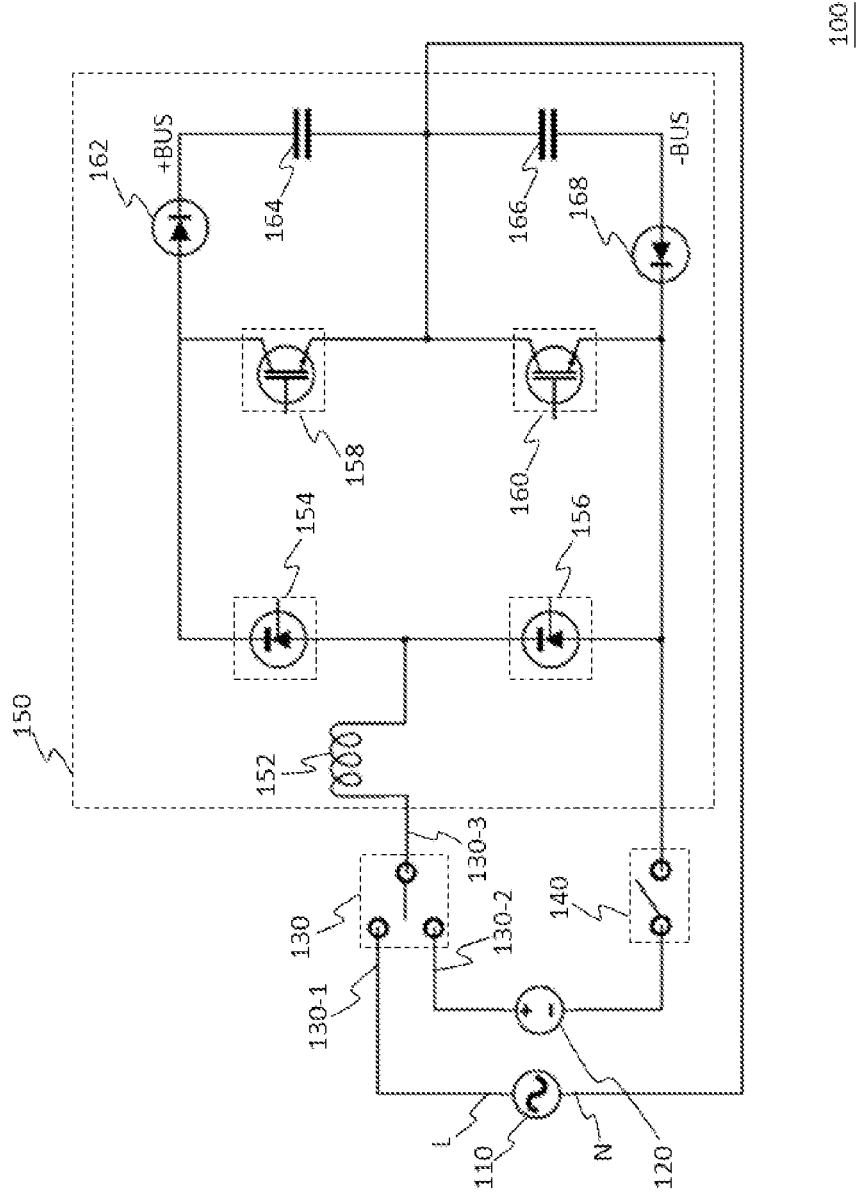
FIG. 1 shows a partial circuit of a conventional uninterruptible power system.
Figure 5:
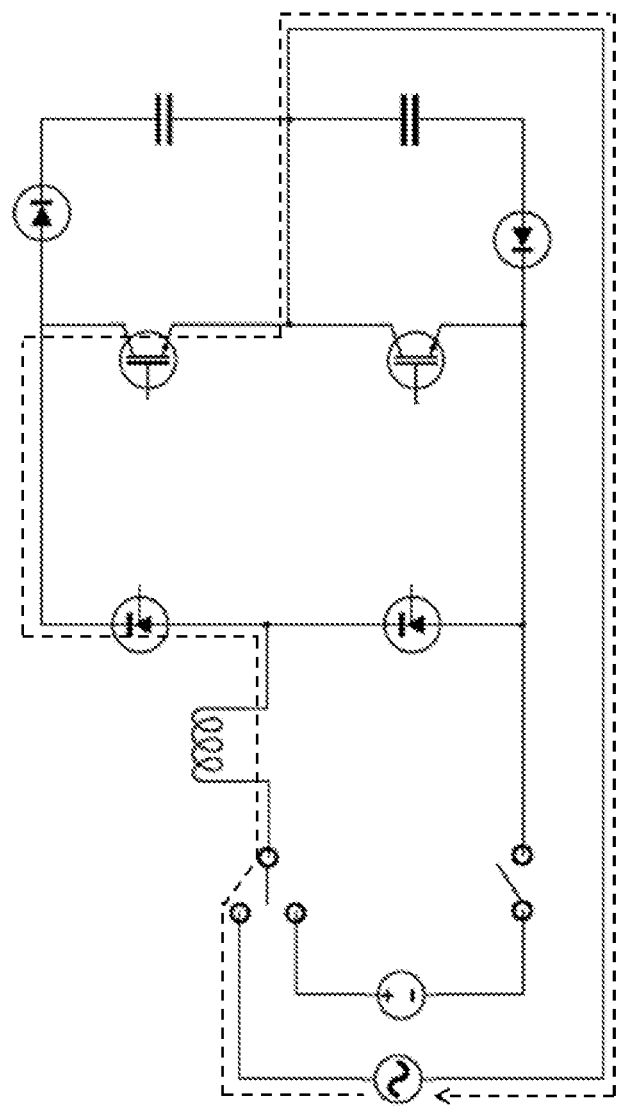
FIG. 5 shows a current path in the uninterruptible power system 100 in one of the states.
Figure 6:
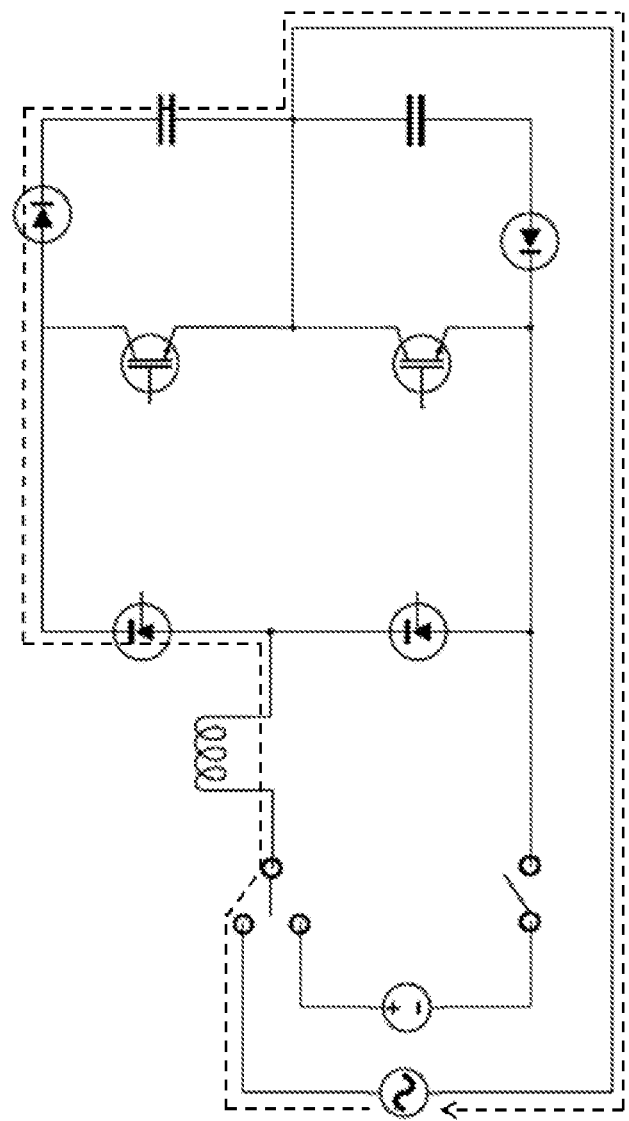
FIG. 6 shows a current path in the uninterruptible power system 100 in one of the states.

Referring to FIG. 1, as a comparison, when the uninterruptible power system 100 is in the online mode and outputs a positive half wave of the AC voltage, the power conversion circuit 150 also continuously switches between a first state and a second state according to a predetermined frequency. The predetermined frequency is, for example, 20 kHz-40 kHz. In the first state, the switches 154 and 158 are turned on, and the switches 156 and 160 are turned off. The current path at this time is shown in FIG. 5. In the second state, the switch 154 is turned on, and the switches 156, 158, and 160 are turned off. The current path at this time is shown in FIG. 6. It can be seen from FIG. 5 that at this time, the current flows through three electronic components in the power conversion circuit 150 in sequence: the inductor 152, the switches 154 and 158. It can be seen from FIG. 6 that at this time, the current flows through four electronic components in the power conversion circuit 150 in sequence: the inductor 152, the switch 154, the diode 162, and the capacitor 164.

Through the above comparison, it can be seen that when the uninterruptible power systems 100 and 200 are in the online mode and both output the positive half wave of the AC voltage, the number of electronic components through which current flows in the power conversion circuit 150 and the power conversion circuit 250 in the first state, respectively, and the number of electronic components through which current flows in the power conversion circuit 150 and the power conversion circuit 250 in the second state, respectively, are shown in Table 1 below:

TABLE 1

| | the number of electronic components through which current flows under the first state | the number of electronic components through which current flows under the second state |
|---|---|---|
| power conversion circuit 250 | 3 pcs | 3 pcs |
| power conversion circuit 150 | 3 pcs | 4 pcs |

It can be seen from Table 1 that in the second state, the number of electronic components through which current flows in the power conversion circuit 250 is less than the number of electronic components through which current flows in the power conversion circuit 150.

Figure 7:
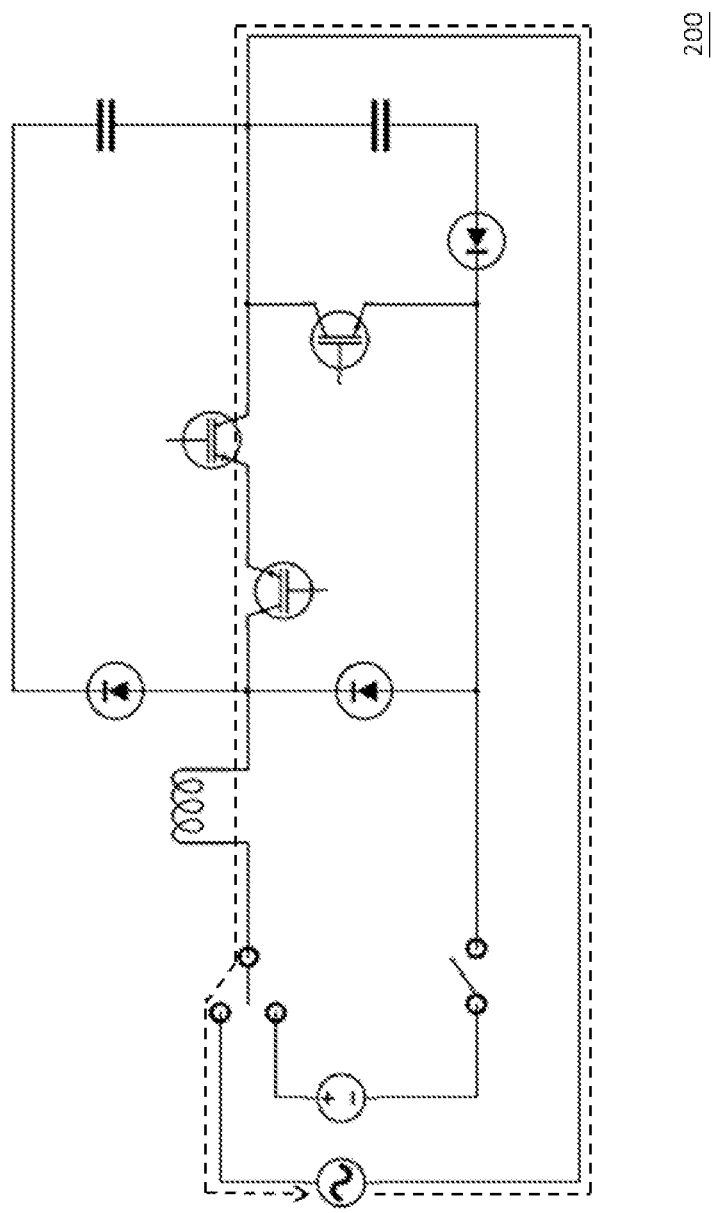
FIG. 7 shows a current path in the uninterruptible power system 200 in one of the states.
Figure 8:
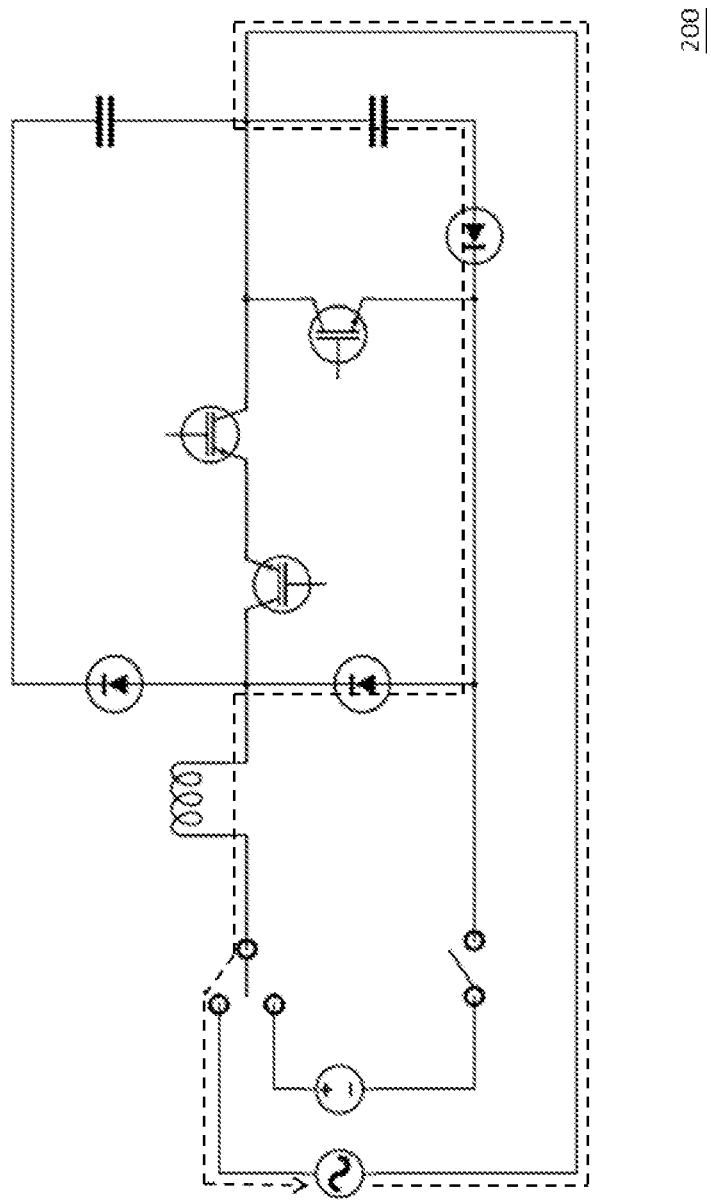
FIG. 8 shows a current path in the uninterruptible power system 200 in one of the states.

Referring to FIG. 2 again, when the uninterruptible power system 200 is in the online mode and outputs a negative half wave of the AC voltage, the power conversion circuit 250 continuously switches between a third state and a fourth state according to a predetermined frequency. The predetermined frequency is, for example, 20 kHz-40 kHz. In the third state, the switches 258 and 260 are turned on, and the switch 262 is turned off. The current path at this time is shown in FIG. 7. In the fourth state, the switches 258, 260, and 262 are turned off. The current path at this time is shown in FIG. 8. It can be seen from FIG. 7 that at this time, the current flows through three electronic components in the power conversion circuit 250 in sequence: the switch 260, the switch 258 and the inductor 252. It can be seen from FIG. 8 that at this time, the current flows through four electronic components in the power conversion circuit 250 in sequence: the capacitor 266, the diode 268, the diode 256 and the inductor 252.

Figure 9:
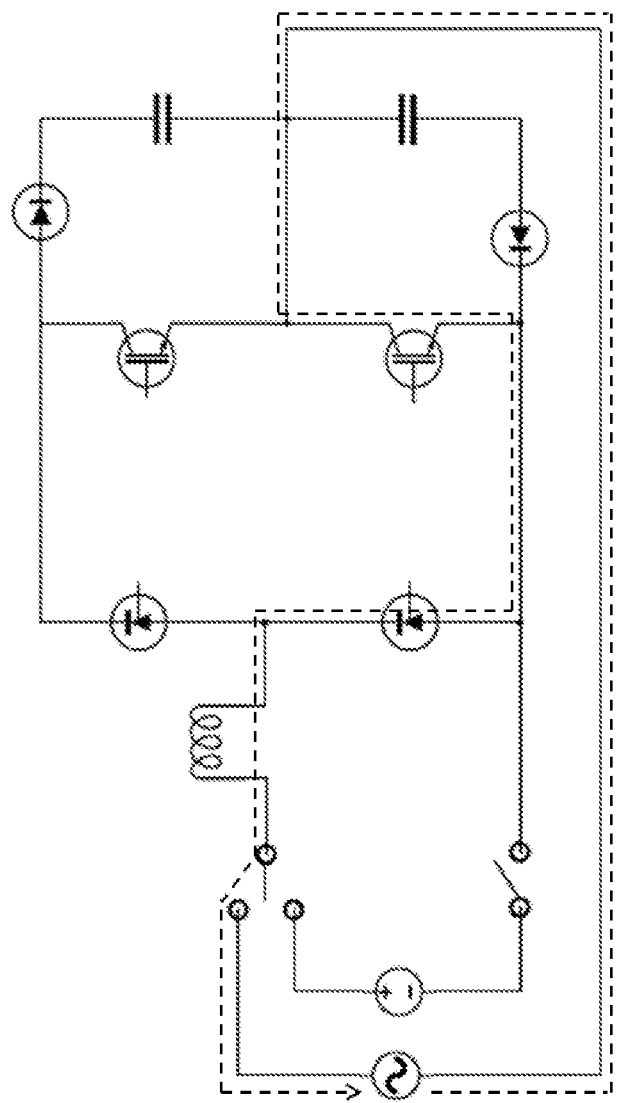
FIG. 9 shows a current path in the uninterruptible power system 100 in one of the states.
Figure 10:
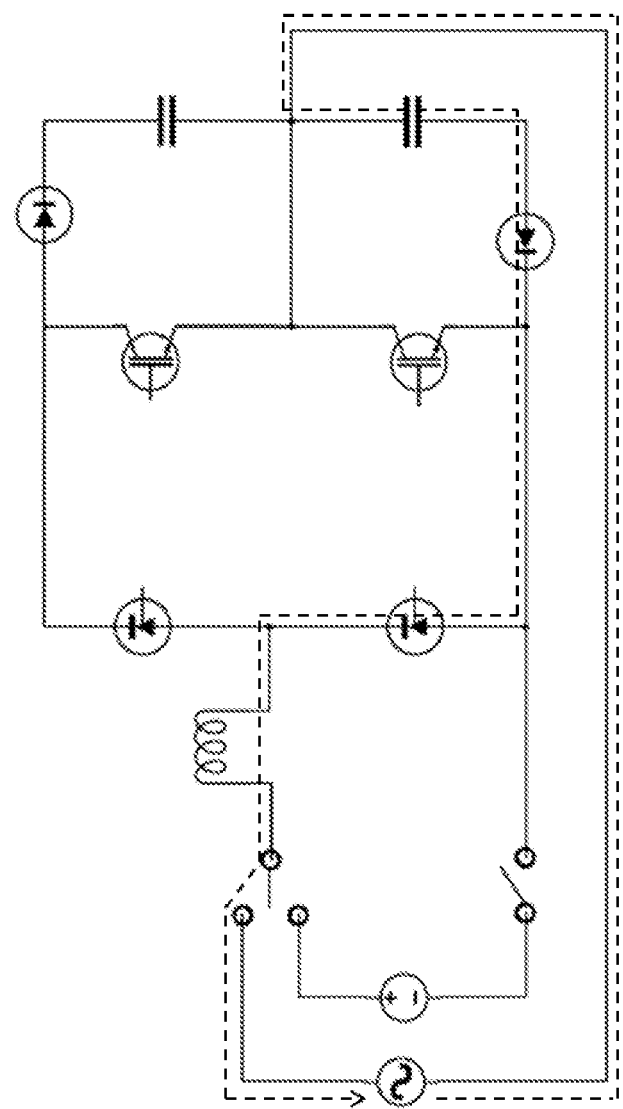
FIG. 10 shows a current path in the uninterruptible power system 100 in one of the states.

Referring to FIG. 1 again, as a comparison, when the uninterruptible power system 100 is in the online mode and outputs a negative half wave of the AC voltage, the power conversion circuit 150 also continuously switches between a the third state and a fourth state according to a predetermined frequency. The predetermined frequency is, for example, 20 kHz-40 kHz. In the third state, the switches 156 and 160 are turned on, and the switches 154 and 158 are turned off. The current path at this time is shown in FIG. 9. In the fourth state, the switch 156 is turned on, and the switches 154, 158, and 160 are turned off. The current path at this time is shown in FIG. 10. It can be seen from FIG. 9 that at this time, the current flows through three electronic components in the power conversion circuit 150 in sequence: the switch 160, the switch 156 and the inductor 152. It can be seen from FIG. 10 that at this time, the current flows through four electronic components in the power conversion circuit 150 in sequence: the capacitor 166, the diode 168, the switch 156 and the inductor 152.

Through the above comparison, it can be seen that when the uninterruptible power systems 100 and 200 are in the online mode and both output the negative half wave of the AC voltage, the number of electronic components through which current flows in the power conversion circuit 150 and the power conversion circuit 250 in the third state, respectively, and the number of electronic components through which current flows in the power conversion circuit 150 and the power conversion circuit 250 in the fourth state, respectively, are shown in Table 2 below:

TABLE 2

| | the number of electronic components through which current flows under the third state | the number of electronic components through which current flows under the fourth state |
|---|---|---|
| power conversion circuit 250 | 3 pcs | 4 pcs |
| power conversion circuit 150 | 3 pcs | 4 pcs |

It can be seen from Table 2 that no matter in the third state or in the fourth state, the number of electronic components through which current flows in the power conversion circuit 250 is equal to the number of electronic components through which current flows in the power conversion circuit 150.

Figure 11:
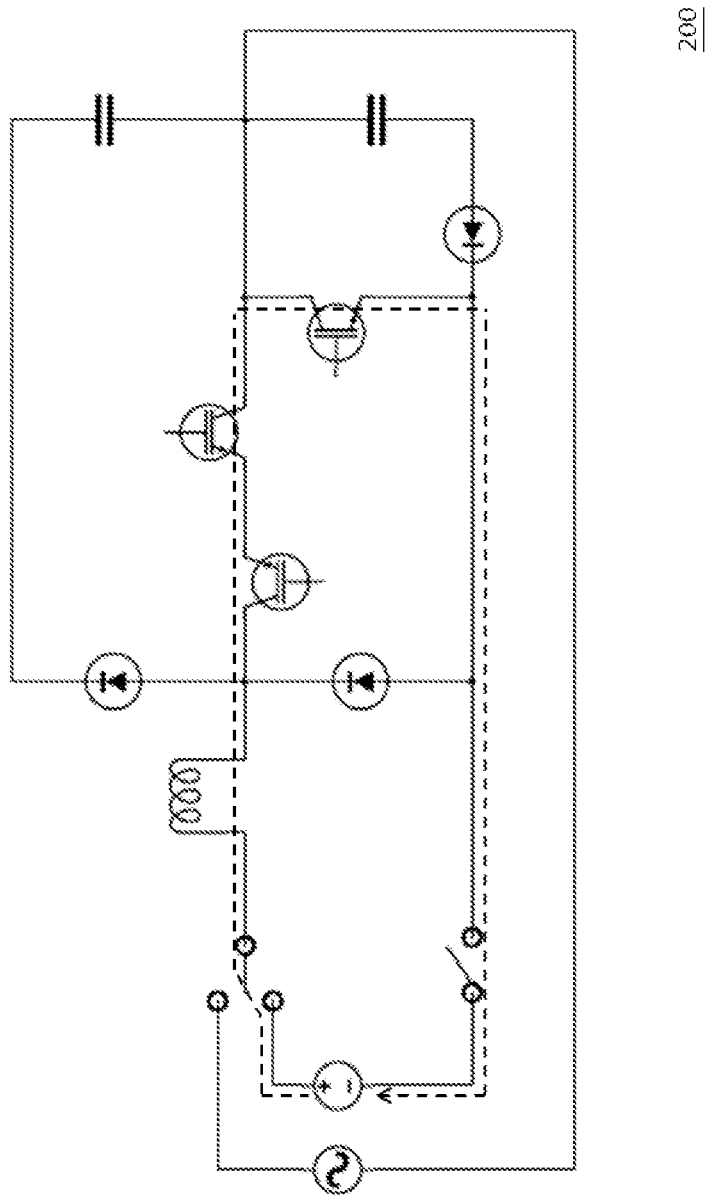
FIG. 11 shows a current path in the uninterruptible power system 200 in one of the states.
Figure 12:
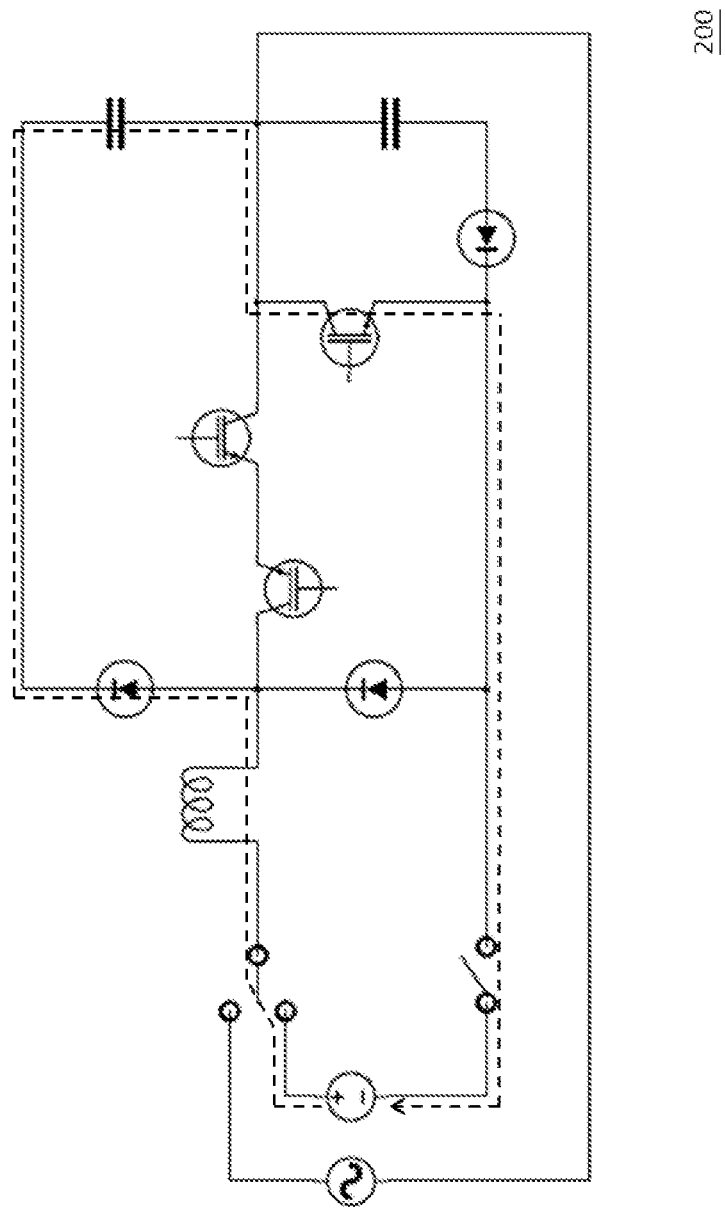
FIG. 12 shows a current path in the uninterruptible power system 200 in one of the states.

Referring to FIG. 2 again, when the uninterruptible power system 200 is in the battery mode and outputs a positive half wave of the AC voltage, the power conversion circuit 250 continuously switches between a fifth state and a sixth state according to a predetermined frequency. The predetermined frequency is, for example, 20 kHz-40 kHz. In the fifth state, the switches 258, 260, and 262 are turned on. The current path at this time is shown in FIG. 11. In the sixth state, the switch 262 is turned on, and the switches 258 and 260 are turned off. The current path at this time is shown in FIG. 12. It can be seen from FIG. 11 that at this time, the current flows through four electronic components in the power conversion circuit 250 in sequence: the inductor 252, the switch 258, the switch 260, and the switch 262. It can be seen from FIG. 12 that at this time, the current flows through four electronic components in the power conversion circuit 250 in sequence: the inductor 252, the diode 254, the capacitor 264, and the switch 262.

Figure 13:
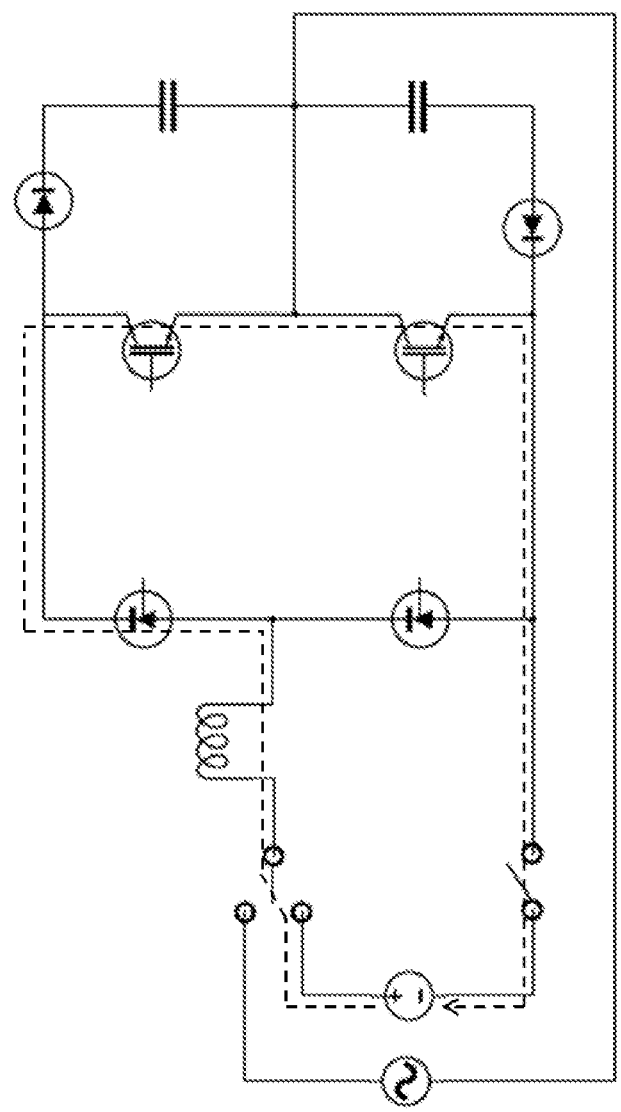
FIG. 13 shows a current path in the uninterruptible power system 100 in one of the states.
Figure 14:
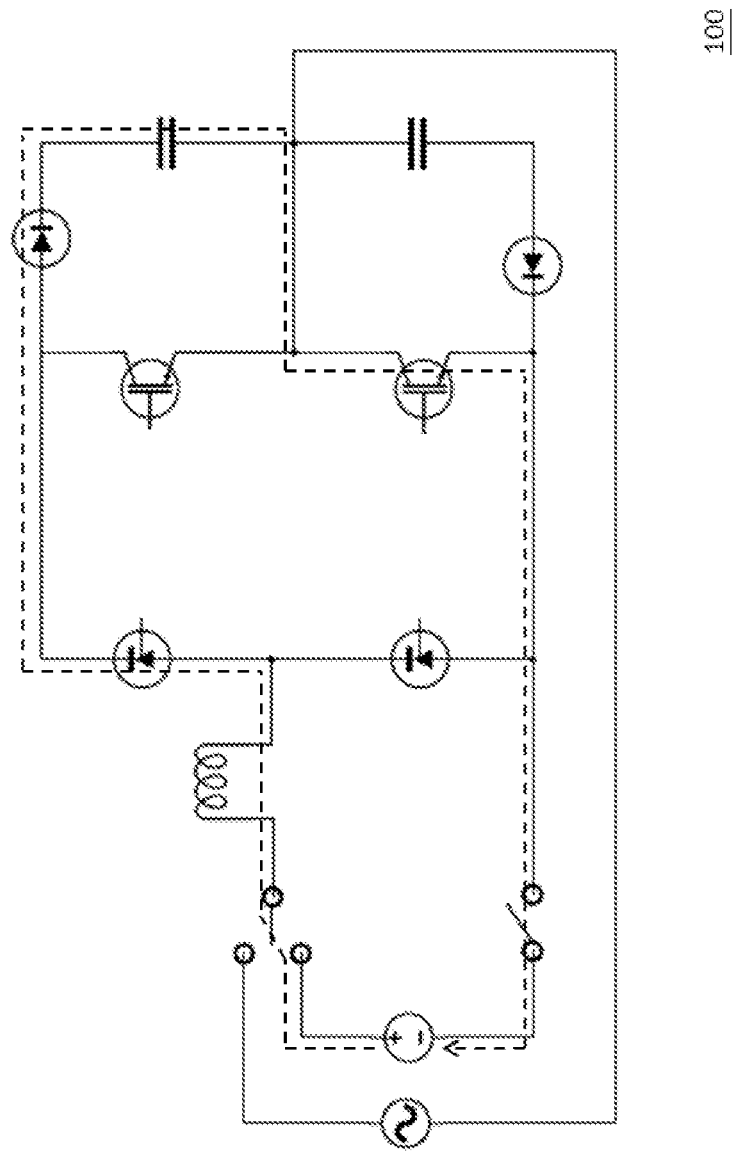
FIG. 14 shows a current path in the uninterruptible power system 100 in one of the states.

Referring to FIG. 1 again, as a comparison, when the uninterruptible power system 100 is in the battery mode and outputs a positive half wave of AC voltage, the power conversion circuit 150 also continuously switches between a fifth state and a sixth state according to a predetermined frequency. The predetermined frequency is, for example, 20 kHz-40 kHz. In the fifth state, the switches 154, 158, and 160 are turned on, and the switch 156 is turned off. The current path at this time is shown in FIG. 13. In the sixth state, the switches 154 and 160 are turned on, and the switches 156 and 158 are turned off. The current path at this time is shown in FIG. 14. It can be seen from FIG. 13 that at this time, the current flows through four electronic components in the power conversion circuit 150 in sequence: the inductor 152, the switch 154, the switch 158, and the switch 160. It can be seen from FIG. 14 that at this time, the current flows through five electronic components in the power conversion circuit 150 in sequence: the inductor 152, the switch 154, the diode 162, the capacitor 164, and the switch 160.

Through the above comparison, it can be seen that when the uninterruptible power systems 100 and 200 are in the battery mode and both output the positive half wave of the AC voltage, the number of electronic components through which current flows in the power conversion circuit 150 and the power conversion circuit 250 in the fifth state, respectively, and the number of electronic components through which current flows in the power conversion circuit 150 and the power conversion circuit 250 in the sixth state, respectively, are shown in Table 3 below:

TABLE 3

|  | the number of electronic components through which current flows under the fifth state | the number of electronic components through which current flows under the sixth state |
| --- | --- | --- |
| power conversion circuit 250 | 4 pcs | 4 pcs |
| power conversion circuit 150 | 4 pcs | 5 pcs |

It can be seen from Table 3 that in the sixth state, the number of electronic components through which current flows in the power conversion circuit 250 is less than the number of electronic components through which current flows in the power conversion circuit 150.

Figure 15:
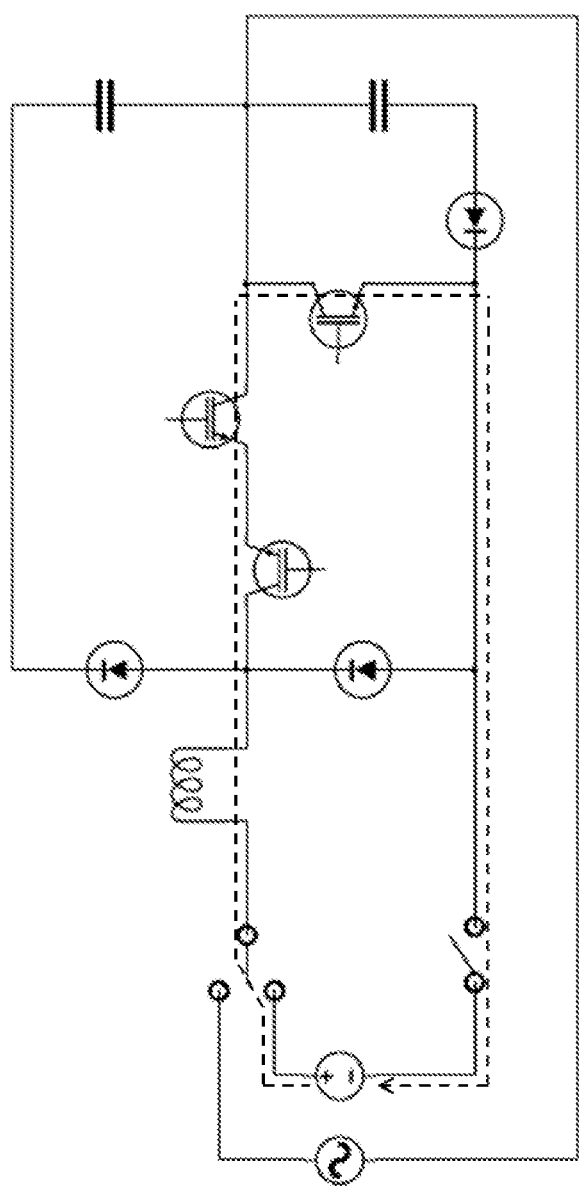
FIG. 15 shows a current path in the uninterruptible power system 200 in one of the states.
Figure 16:
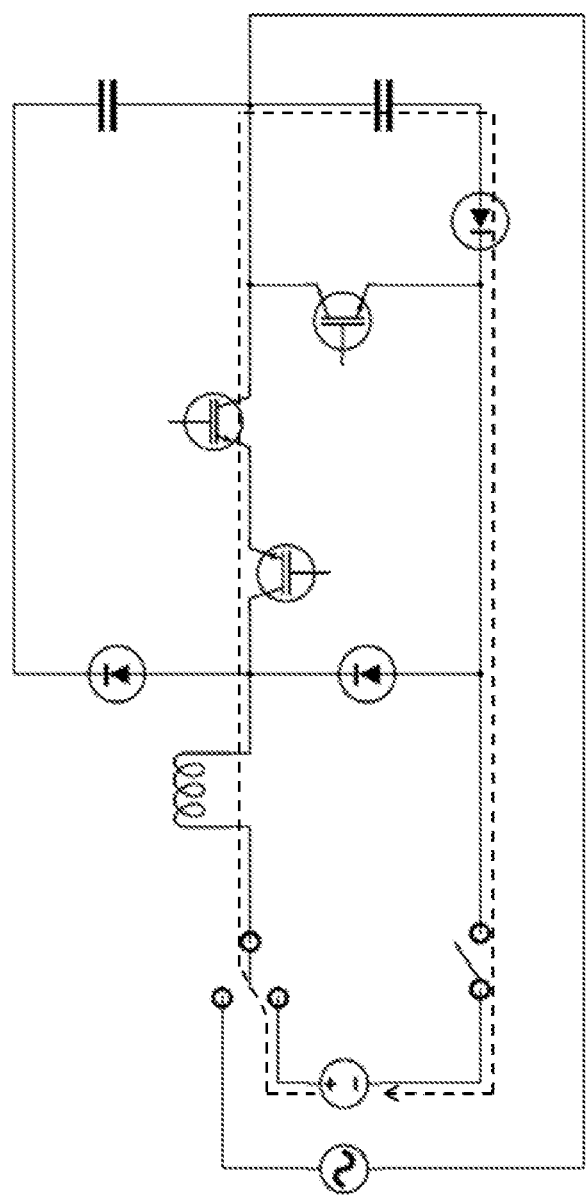
FIG. 16 shows a current path in the uninterruptible power system 200 in one of the states.

Referring to FIG. 2 again, when the uninterruptible power system 200 is in the battery mode and outputs a negative half wave of the AC voltage, the power conversion circuit 250 continuously switches between a seventh state and an eighth state according to a predetermined frequency. The predetermined frequency is, for example, 20 kHz-40 kHz. In the seventh state, the switches 258, 260, and 262 are turned on. The current path at this time is shown in FIG. 15. In the eighth state, the switches 258 and 260 are turned on, and the switch 262 is turned off. The current path at this time is shown in FIG. 16. It can be seen from FIG. 15 that at this time, the current flows through four electronic components in the power conversion circuit 250 in sequence: the inductor 252, the switch 258, the switch 260, and the switch 262. It can be seen from FIG. 16 that at this time, the current flows through five electronic components in the power conversion circuit 250 in sequence: the inductor 252, the switch 258, the switch 260, the capacitor 266, and the diode 268.

Figure 17:
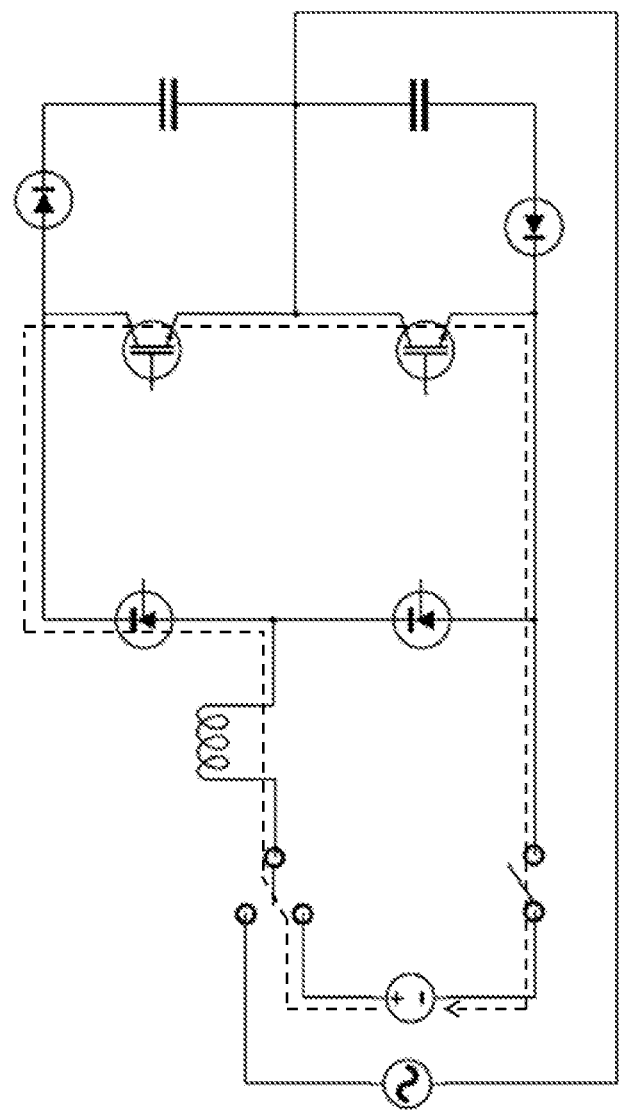
FIG. 17 shows a current path in the uninterruptible power system 100 in one of the states.
Figure 18:
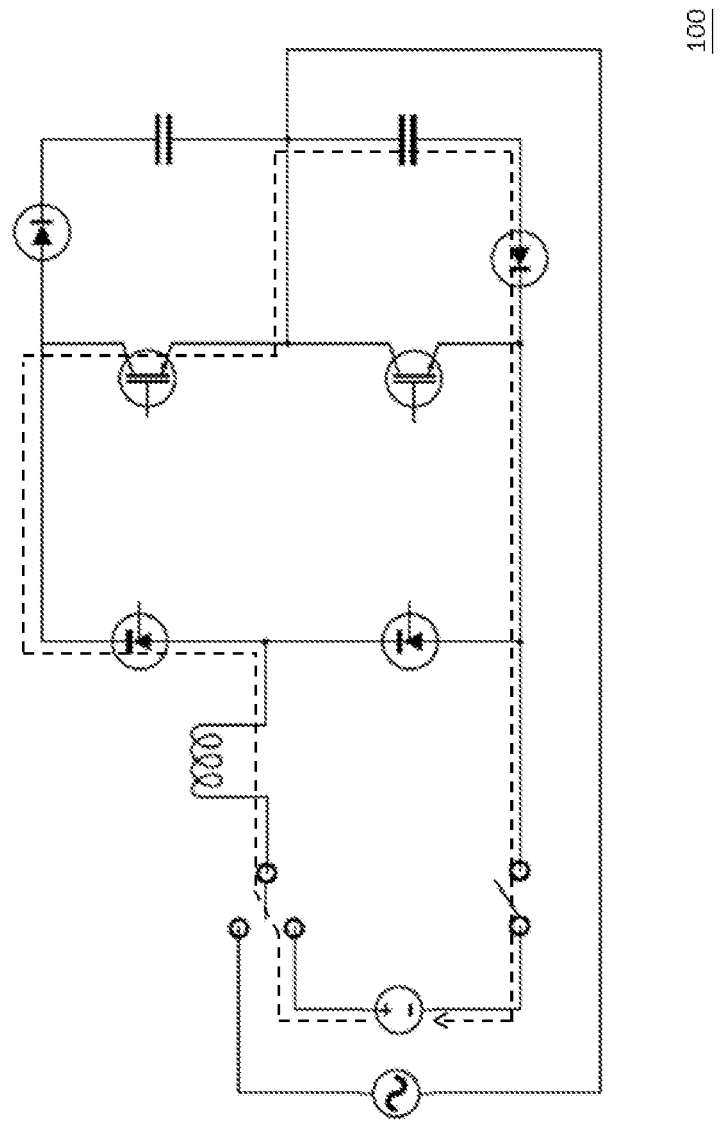
FIG. 18 shows a current path in the uninterruptible power system 100 in one of the states.

Referring to FIG. 1 again, as a comparison, when the uninterruptible power system 100 is in the battery mode and outputs a negative half wave of the AC voltage, the power conversion circuit 150 also continuously switches between a seventh state and an eighth state according to a predetermined frequency. The predetermined frequency is, for example, 20 kHz-40 kHz. In the seventh state, the switches 154, 158, and 160 are turned on, and the switch 156 is turned off. The current path at this time is shown in FIG. 17. In the eighth state, the switches 154 and 158 are turned on, and the switches 156 and 160 are turned off. The current path at this time is shown in FIG. 18. It can be seen from FIG. 17 that at this time, the current flows through four electronic components in the power conversion circuit 150 in sequence: the inductor 152, the switch 154, the switch 158, and the switch 160. It can be seen from FIG. 18 that at this time, the current flows through five electronic components in the power conversion circuit 150 in sequence: the inductor 152, the switch 154, the switch 158, the capacitor 166, and the diode 168.

Through the above comparison, it can be seen that when the uninterruptible power systems 100 and 200 are in the battery mode and both output the negative half wave of the AC voltage, the number of electronic components through which current flows in the power conversion circuit 150 and the power conversion circuit 250 in the seventh state, respectively, and the number of electronic components through which current flows in the power conversion circuit 150 and the power conversion circuit 250 in the eighth state, respectively, are shown in Table 4 below:

TABLE 4

|  | the number of electronic components through which current flows under the seventh state | the number of electronic components through which current flows under the eighth state |
| --- | --- | --- |
| power conversion circuit 250 | 4 pcs | 5 pcs |
| power conversion circuit 150 | 4 pcs | 5 pcs |

It can be seen from Table 4 that no matter in the seventh state or in the eighth state, the number of electronic components through which current flows in the power conversion circuit 250 is equal to the number of electronic components through which current flows in the power conversion circuit 150.

From on the above description, it can be seen that the total number of electronic components through which current flows in the power conversion circuit 250 in different states is 30, and the total number of electronic components through which current flows in the power conversion circuit 150 in different states is 32. Obviously, compared with the power conversion circuit 150, the electronic components of the power conversion circuit 250 causes less power loss during operation. Therefore, compared with the uninterruptible power system 100, the uninterruptible power system 200 has higher overall efficiency, with no need to increase the volume and cost of the heat dissipation system.

Figure 19:
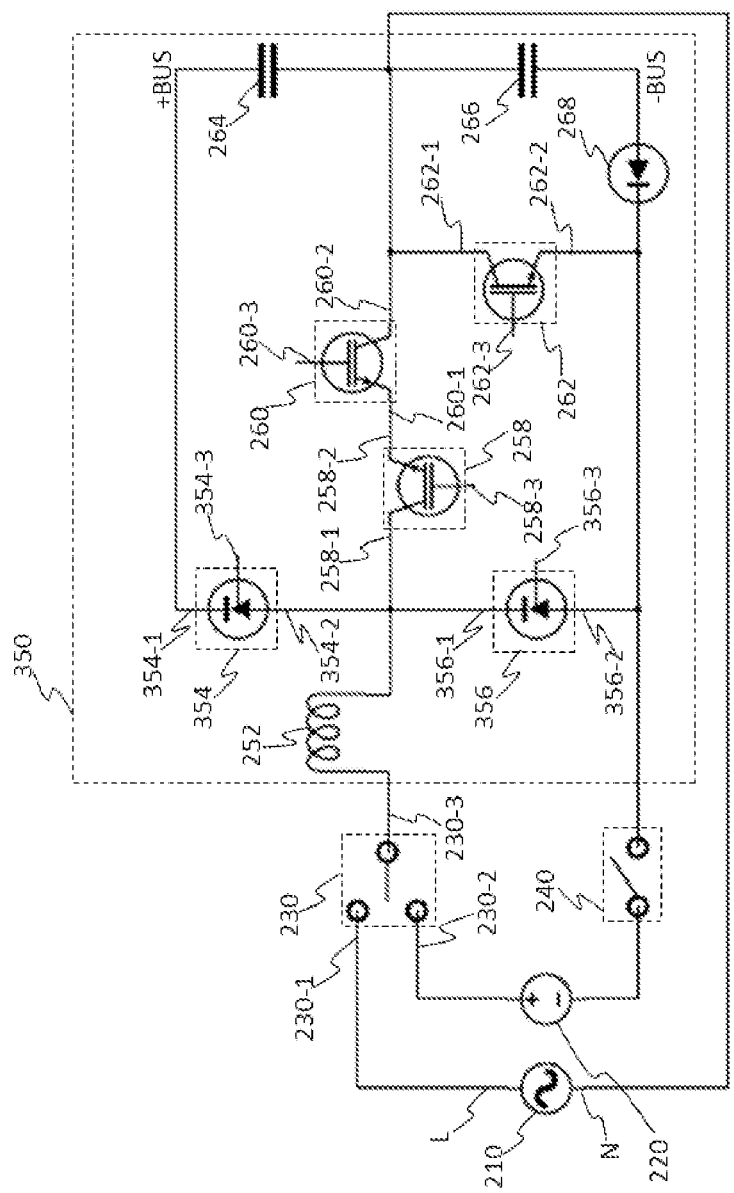
FIG. 19 shows a partial circuit of an uninterruptible power system according to another embodiment of the present invention.

FIG. 19 shows a partial circuit of an uninterruptible power system according to another embodiment of the present invention. In FIG. 19, the same reference numerals as those in FIG. 2 are denoted as the same components. Referring to FIGS. 19 and 2, compared with the uninterruptible power system 200 shown in FIG. 2, the power conversion circuit 350 of the uninterruptible power system 300 shown in FIG. 19 uses the switches 354 and 356 to replace the diodes 254 and 256, respectively. As shown in FIG. 19, the switch 354 has a first terminal 354-1, a second terminal 354-2, and a control terminal 354-3. The first terminal 354-1 of the switch 354 is electrically coupled to a positive DC bus (as indicated by a label +BUS), the second terminal 354-2 of the switch 354 is electrically coupled to one terminal of the inductor 252. The switch 356 has a first terminal 356-1, a second terminal 356-2, and a control terminal 356-3. The second terminal 356-2 of the switch 356 is electrically coupled to a negative DC bus (as indicated by a label −BUS), and the first terminal 356-1 of the switch 356 is electrically coupled to one terminal of the inductor 252.

In this example, the switches 354 and 356 are implemented by silicon controlled rectifiers. For example, a cathode, an anode, and a gate of a silicon controlled rectifier served as the switch 354 can be used as the first terminal 354-1, the second terminal 354-2, and the control terminal 354-3 of the switch 354, respectively.

In summary, since the total number of electronic components through which current flows in the power conversion circuit of the present invention in different states is less than that of the conventional power conversion circuit, the electronic components of the power conversion circuit of the present invention causes less power loss during operation. Therefore, an uninterruptible power system adopting the power conversion circuit of the present invention has higher overall efficiency, with no need to increase the volume and cost of the heat dissipation system.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power conversion circuit for an uninterruptible power system, comprising:
   an inductance;
   a first capacitor, one terminal of which being used as a positive DC bus, and the other terminal being electrically coupled to a neutral wire of an AC input of the uninterruptible power system;
   a second capacitor, one terminal of which being used as a negative DC bus, and the other terminal being electrically coupled to the neutral wire;
   a first switch, having a first terminal, a second terminal and a first control terminal, the first terminal being electrically coupled to one terminal of the inductor;
   a second switch, having a third terminal, a fourth terminal and a second control terminal, the third terminal being electrically coupled to the second terminal, and the fourth terminal being electrically coupled to the neutral wire;
   a third switch, having a fifth terminal, a sixth terminal and a third control terminal, the fifth terminal being electrically coupled to the fourth terminal;
   a first diode, an anode of which being electrically coupled to the first terminal, and a cathode of which being electrically coupled to the positive DC bus;
   a second diode, a cathode of which being electrically coupled to the first terminal, and an anode of which being electrically coupled to the sixth terminal; and
   a third diode, a cathode of which being electrically coupled to the sixth terminal, and an anode of which being electrically coupled to the negative DC bus.

2. The power conversion circuit as claimed in claim 1, wherein when the uninterruptible power system is in an online mode and outputs a positive half wave of an AC voltage, the power conversion circuit continuously switches between a first state and a second state according to a predetermined frequency, wherein in the first state, the first switch and the second switch are turned on, the third switch is turned off, and in the second state, the first switch, the second switch, and the third switch are turned off.

3. The power conversion circuit as claimed in claim 2, wherein when the uninterruptible power system is in the online mode and outputs a negative half wave of the AC voltage, the power conversion circuit continuously switches between a third state and a fourth state according to the predetermined frequency, wherein in the third state, the first switch and the second switch are turned on, the third switch is turned off, and in the fourth state, the first switch, the second switch, and the third switch are turned off.

4. The power conversion circuit as claimed in claim 3, wherein when the uninterruptible power system is in a battery mode and outputs the positive half wave of the AC voltage, the power conversion circuit continuously switches between a fifth state and a sixth state according to the predetermined frequency, wherein in the fifth state, the first switch, the second switch, and the third switch are turned on, and in the sixth state, the first switch and the second switch are turned off, and the third switch is turned on.

5. The power conversion circuit as claimed in claim 4, wherein when the uninterruptible power system is in the battery mode and outputs the negative half wave of the AC voltage, the power conversion circuit continuously switches between a seventh state and an eighth state according to the predetermined frequency, wherein in the seventh state, the first switch, the second switch, and the third switch are turned on, and in the eighth state, the first switch and the second switch are turned on, and the third switch is turned off.

6. The power conversion circuit as claimed in claim 1, wherein the first switch, the second switch and the third switch are insulated gate bipolar transistors.

7. The power conversion circuit as claimed in claim 6, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

8. The power conversion circuit as claimed in claim 1, wherein the first switch, the second switch and the third switch are MOS transistors.

9. The uninterruptible power system as claimed in claim 8, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

10. An uninterruptible power system, comprising:
a power conversion circuit, comprising:
an inductance;
a first capacitor, one terminal of which being used as a positive DC bus, and the other terminal being electrically coupled to a neutral wire of an AC input of the uninterruptible power system;
a second capacitor, one terminal of which being used as a negative DC bus, and the other terminal being electrically coupled to the neutral wire;
a first switch, having a first terminal, a second terminal and a first control terminal, the first terminal being electrically coupled to one terminal of the inductor;
a second switch, having a third terminal, a fourth terminal and a second control terminal, the third terminal being electrically coupled to the second terminal, and the fourth terminal being electrically coupled to the neutral wire;
a third switch, having a fifth terminal, a sixth terminal and a third control terminal, the fifth terminal being electrically coupled to the fourth terminal;
a first diode, an anode of which being electrically coupled to the first terminal, and a cathode of which being electrically coupled to the positive DC bus;
a second diode, a cathode of which being electrically coupled to the first terminal, and an anode of which being electrically coupled to the sixth terminal; and
a third diode, a cathode of which being electrically coupled to the sixth terminal, and an anode being electrically coupled to the negative DC bus;
a fourth switch, having a seventh terminal, an eighth terminal and a ninth terminal, the seventh terminal being electrically coupled to a live wire of the AC input, and the eighth terminal being electrically coupled to a positive electrode of a battery, the ninth terminal being electrically coupled to the other terminal of the inductor; and
a fifth switch, being electrically coupled between a negative electrode of the battery and the cathode of the third diode,
wherein when the uninterruptible power system is in an online mode, the ninth terminal is electrically coupled to the seventh terminal, and the fifth switch is turned off, and when the uninterruptible power system is in a battery mode, the ninth terminal is the terminal is electrically coupled to the eighth terminal, and the fifth switch is turned on.

11. The uninterruptible power system as claimed in claim 10, wherein when the uninterruptible power system is in the online mode and outputs a positive half wave of an AC voltage, the power conversion circuit continuously switches between a first state and a second state according to a predetermined frequency, wherein in the first state, the first switch and the second switch are turned on, the third switch is turned off, and in the second state, the first switch, the second switch, and the third switch are turned off.

12. The uninterruptible power system as claimed in claim 11, wherein when the uninterruptible power system is in the online mode and outputs a negative half wave of the AC voltage, the power conversion circuit continuously switches between a third state and a fourth state according to the predetermined frequency, wherein in the third state, the first switch and the second switch are turned on, the third switch is turned off, and in the fourth state, the first switch, the second switch, and the third switch are turned off.

13. The uninterruptible power system as claimed in claim 12, wherein when the uninterruptible power system is in the battery mode and outputs the positive half wave of the AC voltage, the power conversion circuit continuously switches between a fifth state and a sixth state according to the predetermined frequency, wherein in the fifth state, the first switch, the second switch, and the third switch are turned on, and in the sixth state, the first switch and the second switch are turned off, and the third switch is turned on.

14. The uninterruptible power system as claimed in claim 13, wherein when the uninterruptible power system is in the battery mode and outputs the negative half wave of the AC voltage, the power conversion circuit continuously switches between a seventh state and an eighth state according to the predetermined frequency, wherein in the seventh state, the first switch, the second switch, and the third switch are turned on, and in the eighth state, the first switch and the second switch are turned on, and the third switch is turned off.

15. The uninterruptible power system as claimed in claim 10, wherein the first switch, the second switch and the third switch are insulated gate bipolar transistors.

16. The uninterruptible power system as claimed in claim 15, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

17. The uninterruptible power system as claimed in claim 10, wherein the first switch, the second switch and the third switch are MOS transistors.

18. The uninterruptible power system as claimed in claim 17, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

19. A power conversion circuit of an uninterruptible power system, comprising:
an inductance;
a first capacitor, one terminal of which being used as a positive DC bus, and the other terminal being electrically coupled to a neutral wire of an AC input of the uninterruptible power system;
a second capacitor, one terminal of which being used as a negative DC bus, and the other terminal being electrically coupled to the neutral wire;

a first switch, having a first terminal, a second terminal and a first control terminal, the first terminal being electrically coupled to one terminal of the inductor;

a second switch, having a third terminal, a fourth terminal and a second control terminal, the third terminal being electrically coupled to the second terminal, and the fourth terminal being electrically coupled to the neutral wire;

a third switch, having a fifth terminal, a sixth terminal and a third control terminal, the fifth terminal being electrically coupled to the fourth terminal;

a fourth switch, having a seventh terminal, an eighth terminal and a fourth control terminal, the seventh terminal being electrically coupled to the positive DC bus, and the eighth terminal being electrically coupled to the first terminal;

a fifth switch, having a ninth terminal, a tenth terminal and a fifth control terminal, the ninth terminal being electrically coupled to the first terminal, and the tenth terminal being electrically coupled to the sixth terminal; and a diode, a cathode of which being electrically coupled to the sixth terminal, and an anode of which being electrically coupled to the negative DC bus.

20. The power conversion circuit as claimed in claim 19, wherein when the uninterruptible power system is in an online mode and outputs a positive half wave of an AC voltage, the power conversion circuit continuously switches between a first state and a second state according to a predetermined frequency, wherein in the first state, the first switch and the second switch are turned on, and the third switch, the fourth switch and the fifth switch are turned off, and in the second state, the first switch, the second switch, the third switch, and the fifth switch are turned off, and the fourth switch is turned on.

21. The power conversion circuit as claimed in claim 20, wherein when the uninterruptible power system is in the online mode and outputs a negative half wave of the AC voltage, the power conversion circuit continuously switches between a third state and a fourth state according to the predetermined frequency, wherein in the third state, the first switch and the second switch are turned on, and the third switch, the fourth switch and the fifth switch are turned off, and in the fourth state, the first switch, the second switch, the third switch, and the fourth switch are turned off, and the fifth switch is turned on.

22. The power conversion circuit as claimed in claim 21, wherein when the uninterruptible power system is in a battery mode and outputs the positive half wave of the AC voltage, the power conversion circuit continuously switches between a fifth state and a sixth state according to the predetermined frequency, wherein in the fifth state, the first switch, the second switch, and the third switch are turned on, and the fourth switch and the fifth switch are turned off, and in the sixth state, the first switch, the second switch and the fifth switch are turned off, and the third switch and the fourth switch are turned on.

23. The power conversion circuit as claimed in claim 22, wherein when the uninterruptible power system is in the battery mode and outputs the negative half wave of the AC voltage, the power conversion circuit continuously switches between a seventh state and an eighth state according to the predetermined frequency, wherein in the seventh state, the first switch, the second switch and the third switch are turned on, and the fourth switch and the fifth switch are turned off, and in the eighth state, the first switch and the second switch are turned on, and the third switch, the fourth switch and the fifth switch are turned off.

24. The power conversion circuit as claimed in claim 19, wherein the first switch, the second switch and the third switch are insulated gate bipolar transistors.

25. The power conversion circuit as claimed in claim 24, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

26. The power conversion circuit as claimed in claim 19, wherein the first switch, the second switch and the third switch are MOS transistors.

27. The uninterruptible power system as claimed in claim 26, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

28. The power conversion circuit as claimed in claim 19, wherein the fourth switch and the fifth switch are silicon controlled rectifiers.

29. An uninterruptible power system, comprising:
a power conversion circuit, comprising:
an inductance;
a first capacitor, one terminal of which being used as a positive DC bus, and the other terminal being electrically coupled to a neutral wire of an AC input of the uninterruptible power system;
a second capacitor, one terminal of which being used as a negative DC bus, and the other terminal being electrically coupled to the neutral wire;
a first switch, having a first terminal, a second terminal and a first control terminal, the first terminal being electrically coupled to one terminal of the inductor;
a second switch, having a third terminal, a fourth terminal and a second control terminal, the third terminal being electrically coupled to the second terminal, and the fourth terminal being electrically coupled to the neutral wire;
a third switch, having a fifth terminal, a sixth terminal and a third control terminal, the fifth terminal being electrically coupled to the fourth terminal;
a fourth switch, having a seventh terminal, an eighth terminal and a fourth control terminal, the seventh terminal being electrically coupled to the positive DC bus, and the eighth terminal being electrically coupled to the first terminal;
a fifth switch, having a ninth terminal, a tenth terminal and a fifth control terminal, the ninth terminal being electrically coupled to the first terminal, and the tenth terminal being electrically coupled to the sixth terminal; and
a diode, a cathode of which being electrically coupled to the sixth terminal, and an anode of which being electrically coupled to the negative DC bus;

a sixth switch, having an eleventh terminal, a twelfth terminal and a thirteenth terminal, the eleventh terminal being electrically coupled to a live wire of the AC input, and the twelfth terminal being electrically coupled to a positive electrode of the battery, the thirteenth terminal being electrically coupled to the other terminal of the inductor; and a seventh switch, being electrically coupled between a negative electrode of the battery and the cathode of the diode, wherein when the uninterruptible power system is in an online mode, the thirteenth terminal is electrically coupled to the eleventh terminal, and the seventh switch is turned off, and when the uninterruptible power system is in a battery mode, the thirteenth terminal is electrically coupled to the twelfth terminal, and the seventh switch is turned on.

30. The uninterruptible power system as claimed in claim 29, wherein when the uninterruptible power system is in the online mode and outputs a positive half wave of an AC voltage, the power conversion circuit continuously switches between a first state and a second state according to a predetermined frequency, wherein in the first state, the first switch and the second switch are turned on, and the third switch, the fourth switch and the fifth switch are turned off, and in the second state, the first switch, the second switch, the third switch, and the fifth switch are turned off, and the fourth switch is turned on.

31. The uninterruptible power system as claimed in claim 30, wherein when the uninterruptible power system is in the online mode and outputs a negative half wave of the AC voltage, the power conversion circuit continuously switches between a third state and a fourth state according to the predetermined frequency, wherein in the third state, the first switch and the second switch are turned on, and the third switch, the fourth switch and the fifth switch are turned off, and in the fourth state, the first switch, the second switch, the third switch, and the fourth switch are turned off, and the fifth switch is turned on.

32. The uninterruptible power system as claimed in claim 31, wherein when the uninterruptible power system is in the battery mode and outputs the positive half wave of the AC voltage, the power conversion circuit continuously switches between a fifth state and a sixth state according to the predetermined frequency, wherein in the fifth state, the first switch, the second switch, and the third switch are turned on, and the fourth switch and the fifth switch are turned off, and in the sixth state, the first switch, the second switch and the fifth switch are turned off, and the third switch and the fourth switch are turned on.

33. The uninterruptible power system as claimed in claim 32, wherein when the uninterruptible power system is in the battery mode and outputs the negative half wave of the AC voltage, the power conversion circuit continuously switches between a seventh state and an eighth state according to the predetermined frequency, wherein in the seventh state, the first switch, the second switch and the third switch are turned on, and the fourth switch and the fifth switch are turned off, and in the eighth state, the first switch and the second switch are turned on, and the third switch, the fourth switch and the fifth switch are turned off.

34. The uninterruptible power system as claimed in claim 29, wherein the first switch, the second switch and the third switch are insulated gate bipolar transistors.

35. The uninterruptible power system as claimed in claim 34, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

36. The uninterruptible power system as claimed in claim 29, wherein the first switch, the second switch and the third switch are MOS transistors.

37. The uninterruptible power system as claimed in claim 36, wherein the first switch has a first body diode, the second switch has a second body diode, and the third switch has a third body diode, wherein a cathode and an anode of the first body diode are electrically coupled to the first terminal and the second terminal, respectively, a cathode and an anode of the second body diode are electrically coupled to the fourth terminal and the third terminal, respectively, and a cathode and an anode of the third body diode are electrically coupled to the fifth terminal and the sixth terminal, respectively.

38. The uninterruptible power system as claimed in claim 29, wherein the fourth switch and the fifth switch are silicon controlled rectifiers.

* * * * *